United States Patent
Bohm et al.

(10) Patent No.: US 7,039,142 B1
(45) Date of Patent: May 2, 2006

(54) SYNCHRONIZATION METHOD AND APPARATUS

(75) Inventors: Christer Bohm, Nacka (SE); Bengt J. Olsson, Tumba (SE); Magnus Danielson, Stocksund (SE)

(73) Assignee: Net Insight AB, Stockholm (SE)

( * ) Notice: Subject to any disclaimer, the term of this patent is extended or adjusted under 35 U.S.C. 154(b) by 0 days.

(21) Appl. No.: 10/009,552

(22) PCT Filed: May 4, 2000

(86) PCT No.: PCT/SE00/00873
§ 371 (c)(1),
(2), (4) Date: Mar. 21, 2002

(87) PCT Pub. No.: WO00/69107
PCT Pub. Date: Nov. 16, 2000

(30) Foreign Application Priority Data
May 6, 1999 (SE) .................................. 9901654

(51) Int. Cl.
H04L 7/00 (2006.01)
H04L 7/06 (2006.01)
(52) U.S. Cl. .................. 375/365; 375/364; 370/510
(58) Field of Classification Search ................ 375/357, 375/365, 366, 145, 149, 371; 370/510, 507, 370/509, 516, 324, 350, 395.62, 400, 396.62; 342/395; 340/681, 312
See application file for complete search history.

(56) References Cited

U.S. PATENT DOCUMENTS

| 4,511,859 | A |   | 4/1985 | Dombrowski ................ 331/11 |
| 4,672,299 | A |   | 6/1987 | Grimes et al. .............. 323/217 |
| 4,736,393 | A | * | 4/1988 | Grimes et al. .............. 375/356 |
| 4,912,706 | A | * | 3/1990 | Eisenberg et al. .......... 370/507 |
| 5,515,401 | A | * | 5/1996 | Takenaka et al. ........... 375/344 |
| 5,524,029 | A | * | 6/1996 | Takenaka et al. ........... 375/356 |
| 5,615,177 | A | * | 3/1997 | Yahata ....................... 368/10 |
| 5,936,472 | A |   | 8/1999 | Wakayama ................. 331/11 |

FOREIGN PATENT DOCUMENTS

SE 9704067-9 5/1999
WO WO99/25099 5/1999

OTHER PUBLICATIONS

Bohm et al., *The DTM Gigabit Network*, 3 Journal of High Speed Networks 109-26 (IOS Press, 1994).
Gauffin et al., *Multi-gigabit networking based on DTM*, 24 Computer Networks and ISDN Systems 119-30 (Amsterdam, 1992).

* cited by examiner

Primary Examiner—Jean Corrielus
Assistant Examiner—Qutub Ghulamali
(74) Attorney, Agent, or Firm—Finnegan, Henderson, Farabow, Garrett & Dunner LLP

(57) ABSTRACT

The present invention refers to a method and an apparatus for synchronizing operation at a node of a communication network.

According to the invention a phase relationship between an output frame synchronization signal and an input frame synchronization signal is controlled by the adjustment of a phase difference between the output frame synchronization signal and a node synchronization signal.

18 Claims, 5 Drawing Sheets

SYNCHRONIZATION METHOD AND APPARATUS

TECHNICAL FIELD OF INVENTION

The present invention refers to a method and an apparatus for synchronizing operation at a node of a communication network.

BACKGROUND OF THE INVENTION

In all communication networks, an essential task to be addressed is how to synchronize the operation of the network and of the different equipment and components that form part of the network. Prior art provides many different approaches to address this task.

In most synchronous network systems, the operation of the entire network is strictly synchronized to a common synchronization source. In one example thereof, each node has its own direct connection to this common synch-synchronization source, which is thereby connected to directly synchronize the operation at each node of the network. In another example, synchronization is forwarded from the common synchronization source through the network as such to reach all network nodes in a top-down manner, forming a so-called synchronization spanning-tree within the net-work. In the latter example, each output port of a node is typically strictly synchronized according to synchronization signals received at a currently designated input port of said node.

However, prior art schemes for distributing a frame frequency within a network while maintaining a high synchronization quality to reduce jitter are complicated and often require the use of expensive components and solutions while placing stringent requirements on the tow-down hierarchy, the network jitter, and/or negatively affecting data transport delays within the system.

The object of the invention is therefore to provide a simple and effective solution that provides a relaxed more flexible basis when defining synchronization trees within a network and at the same time allows for optimization of the way in which synchronization is propagated at a node of the network.

SUMMARY OF THE INVENTION

The above mentioned objects are achieved by the invention as defined in the accompanying claims.

According to an aspect of the invention, receiving two or more input frame synchronization signals are received at a node of the network, which in turn transmits an output frame synchronization signal, the output frame synchronization signal being associated with a predefined one of said input frame synchronization signals. For example, this association will typically be the association between an input port and an output port forming part of the same interface. A node common synchronization signal is then derived based upon a currently selected one of said input frame synchronization signals. The output frame synchronization signal is in turn generated using the node common frame synchronization signal as reference for synchronization. Moreover, a phase relationship between the output frame synchronization signal and the input frame synchronization signal that is associated therewith is determined. Based thereupon, said phase relationship is adjusted by the step of adjusting a phase relationship between the output frame synchronization signal and the node common synchronization signal when generating the output frame synchronization signal.

An advantage of the invention is that it makes it possible to design a network wherein the frame synchronization signal transmitted from an output port of a node is not synchronized strictly according to receptions of a frame synchronization signal received at the associated input port of the node, for example the input port forming part of the same interface as the output port. Instead, the frame synchronization signal transmitted from the output port is primarily synchronized in relation to the occurrences of a node common synchronization signal, thereby gaining the quality of the node common synchronization signal, and indirectly according to the receptions of the frame synchronization signal received at the associated input port, thereby to adjust the delay with respect to the input port.

This means that if the node for example is connected to a unidirectional communication bus, said input port being connected to receive frames of data from said bus and said output port being connected to transmit frames of data to said bus, the transmission of frames from the output port need not be strictly synchronized to the reception of frames at the input port. The output port may instead be synchronized according to a frame signal that, for example, is received at another port of the node (typically nominally having the same frame frequency as the one on said input port, or a multiple thereof), but then in such a way that the phase relationship between the reception of frames from the input port and the transmission of frames from the output port is taken into consideration. In other words, when the input port and the output port together form an interface to a unidirectional bus, the synchronization signal that is used to synchronize the operation at the output port need not be the synchronization signal that is received from the unidirectional link that is received at said input port. As a consequence, the actual "time-keeper" on a bus need not be a head end node on the bus, or, in broader terms, the actual frame synchronization tree need not strictly coincide with a data transport tree. This consequently has the advantage of allowing a greater freedom and flexibility when defining and building a synchronization tree of the above-mentioned kind for propagating synchronization signals through a communication network.

Another advantage of the invention is that is makes it possible to control the delay through the node in a very simple and flexible way. For example, when a node is connected to a unidirectional communication bus in the above-mentioned manner, it generally preferred that the delay, i.e. the time period between the point in time when a time slot of data is received at the input port and when it is transmitted from the output port, is as low as possible. In other words, it is preferred that frames of data received at said input port is transmitted as soon as possible from the output port. This would imply that the difference in time between the reception of an input frame synchronization signal and the transmission of an output frame synchronization signal should be as low as possible. However, a low delay typically implies the use of very low fill levels in buffers that are typically used at said ports for temporarily storing said data. Consequently, if a small fluctuation in synchronization rates or in data forwarding mechanisms occurs, there is a risk that said buffers will run empty, which may have the effect that there is no valid data available for transmission when transmission is due. Therefore, a certain level of buffering is preferred. Consequently, the difference in time between the reception of the input frame synchronization signal and the transmission of the output frame synchronization signal should not be too low. Whether needed as a result of these or other considerations, the invention provides a very simple solution for controlling the delay as desired.

This feature is also very advantageous when a plurality of nodes are connected to a unidirectional bus that forms a single ring or loop with one node acting as head as well as terminating end of the loop. When closing the loop, the point in time at which the head end node transmits the start of a frame as head-end will typically not coincide with the point in time that it receives the start of a frame as terminating-end. If this difference in time should, for example, correspond to half a frame, then half a frame of data would have to be buffered at the head end node. This could for example mean a communication channel that is set up over a portion of the ring that includes the head-end node would show a large delay as compared to a communication channel that is set up over a portion of the ring that does not include the head-end node. However, by controlling the delay at the different nodes connected to the loop, in accordance with the invention, the required buffering needed to accommodate for the half-frame difference created by the closing of the loop may be distributed among all nodes of the ring in any desired way. If the required buffering for example were distributed evenly among all nodes of the ring, a communication channel established over the ring will show the same delay irrespective of which portion of the ring that is established over. The delay would of course then still be a function of the number of nodes that the channel passes on the ring.

As an alternative to the latter situation, if the situation is such that a majority of the communication channels that are established over the ring is done so over a specific portion of the ring, it may be desirable to keep the buffering, and consequently, the delay over this portion of the ring to a minimum. It would then be preferred to redistribute the buffering that is required as a result of the closing of the ring to a portion of the ring over which only a minority of the communication channels are established.

To be understood, the node synchronization signal may for example be generated using another input frame synchronization signal received at an input port of the node, a synchronization signal generated locally at said node, or even another output frame synchronization signal transmitted from another port of the node, as reference. The node synchronization signal may in fact itself be another input frame synchronization signal, a synchronization signal generated locally at said node, or another output frame synchronization signal transmitted from another port of the node.

However, according to a preferred embodiment, said node synchronization is generated using a signal of two or more input frame synchronization signals as reference. Furthermore, it is preferred that said node synchronization signal is generated in such a way that a change of input frame synchronization signal to be used as said reference does not cause any phase shifts in said node synchronization signal. The latter may for example be accomplished by the step of determining the frame phase difference between said node synchronization signal and one of said input frame synchronization signals that is to be used as said reference and to change into using this signal as reference in such a way that the determined frame phase difference is maintained. As this feature has the advantage of not causing any phase-shifts in the node synchronization signal, and as the node synchronization signal is used as reference for transmitting said output frame synchronization signal, a phase-shift free behavior of the output frame synchronization signal is ensured when a switch of synchronization source is required. For definition, a phase-shift herein refers to the situation wherein an essential discontinuity, or "jump", occurs or is generated in the phase of a signal.

According to an embodiment of the invention, output frame synchronization signals transmitted from two or more output ports of said node are controlled to show a respective phase difference in relation to said node synchronization signal, the respective phase differences being permissible to be adjusted individually for each respective output port. This embodiment has the advantage of allowing for different phase situations to exist simultaneously at different output ports of the node.

The invention is especially advantageous in networks wherein the synchronization requirements are such that each frame synchronization signal may show a limited jitter and may be arbitrarily located in phase in relation to other frame synchronization signals, but may not show any persistent frame drift in relation to other frame synchronization signals. For example, the maximum allowable jitter may be 1000 ppm and the maximum allowable frame drift may be one (1) frame.

Specifically, the invention is contemplated for use in a DTM-network (Dynamic synchronous Transfer Mode) wherein the synchronous multi-topology network are provided with mesochronous properties to provide for simpler design and architectural freedom of the network as well as the network nodes. Further information on the basics of DTM technology is found in "The DTM Gigabit Network", Christer Bohm, Per Lindgren, Lars Ramfelt, and Peter Sjödin, Journal of High Speed Networks, 3(2):109–126, 1994, and "Multi-gigabit networking based on DTM", Lars Gauffin, Lars Hakansson, and Björn Pehrson, Computer networks and ISDN Systems, 24(2):119–139, April 1992.

As noted, the invention is primarily conserned with the propagation of synchronization on a frame level. To be understood means for providing synchronization on a bit or slot level, while synchronizing a bit frequency and/or a slot frequency, could be added as well. However, note that for example in the DTM network, a nominal bit frequency will be generated individually by each node for and will thus essentially not be propagated through the network.

This application is one in a series of three applications that were filed at the Swedish Patent Office on the same day, having the same title, the same applicant, and all referring to related inventive ideas, the description of the other two hereby being incorporated herein by reference.

The above mentioned and other aspects, features and details of the invention will be more fully understood from the following description of a preferred embodiment thereof.

BRIEF DESCRIPTION OF THE DRAWINGS

Exemplifying embodiments of the invention will now be described with reference to the accompanying drawings, wherein.

DETAILED DESCRIPTION OF PREFERRED EMBODIMENTS

Figure 1:
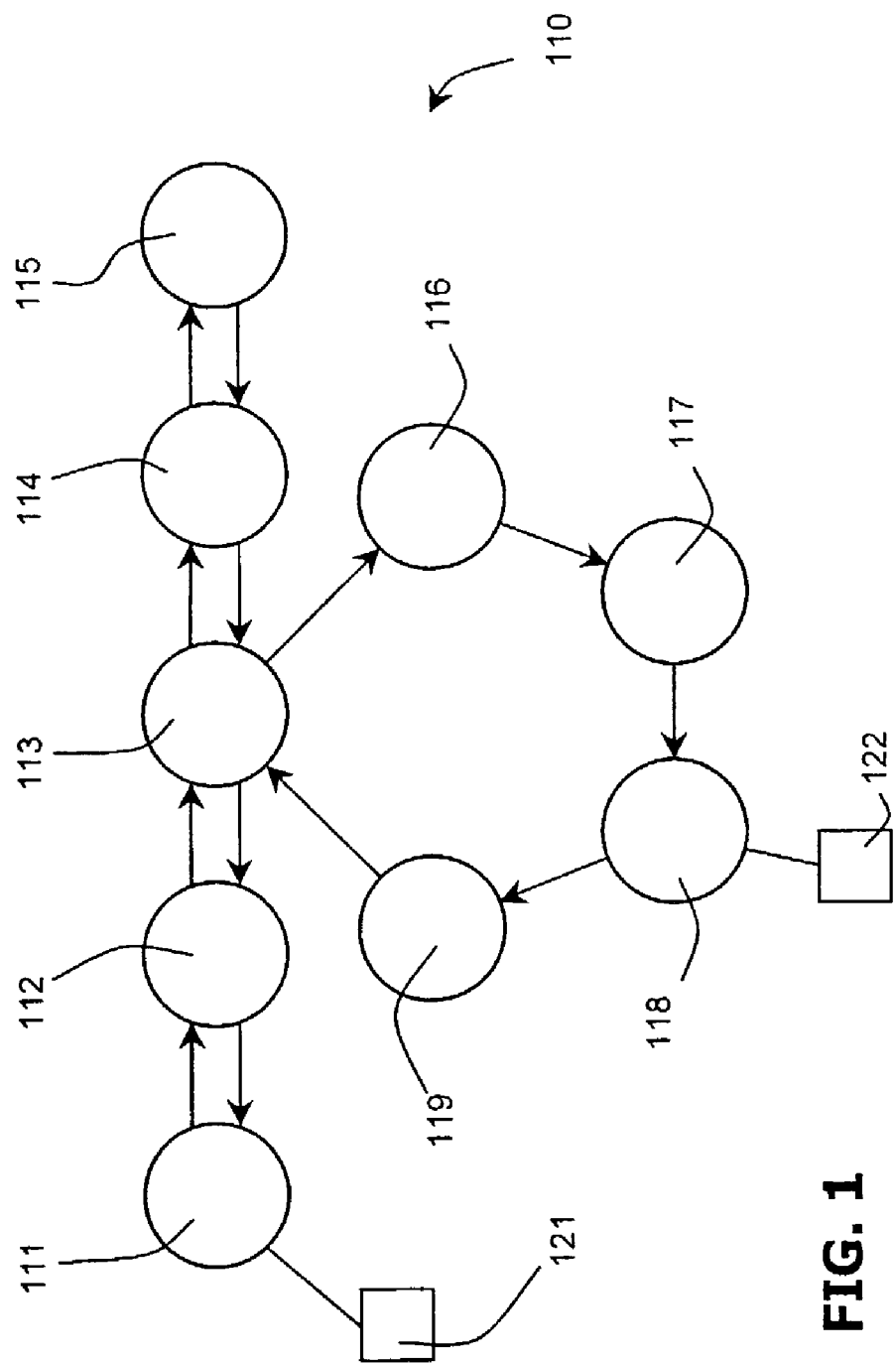
FIG. 1 schematically shows a DTM network.

FIG. 1 schematically shows a DTM network 110 comprising nine nodes 111–119 that are interconnected via uni-directional network links, for example in the form of optical fibers, illustrated as arrows. For example, node 111 is connected directly to node 112 via two unidirectional links (one output link connected to transport signals to node 112 and one input link connected to transport signals in the opposite direction, i.e. from node 112). Similarily, node 113 is connected to node 112 via two unidirectional links (one output link transporting signals to node 112 and one input link transporting signals from node 112), to node 114 via two unidirectional links (one output link transporting signals to node 114 and one input link transporting signals from node 114), to node 116 via one unidirectional output link transporting signals to node 116, and to node 119 via one unidirectional input link transporting signals from node 119.

In FIG. 1, the links that interconnect nodes 111–115 may each be configured as a point-to-point link. However, more preferably, nodes 111–115 will be configured to regard these links as together forming a bi-directional, multi-access double bus. Similarly, nodes 113, 116, 117, 118, and 119 will typically be configured to regard the links that interconnect nodes 113, 116, 117, 118, and 119 as together forming a unidirectional, multi-access single ring bus.

The network 110 also comprises two external clock reference sources 121 and 122, such as atomic or GPS clocks, connected to node 111 and node 118, respectively. In addition, each one of the nodes 111–119 comprises a respective internal clock reference source (not shown). To make sure that there is only one reference source that is used as synchronization master with in the network at each point in time, each reference source is assigned a so-called reference source priority.

In the exemplifying network, in order to establish synchronization within the network 110, each node 111–119 is arranged to transmit so called synchronization messages to its neighbors, more specifically to neighbors that it has an output link to, and will receive similar synchronization messages from neighbors that it has a input link from. Each message will contain information related to the quality of synchronization available at the node transmitting the message. Based upon such synchronization information received in such messages, each node will select which node, or rather which input link, to use as its reference for synchronization, i.e. to use as synchronization source, as will be described more in detail below.

Figure 2:
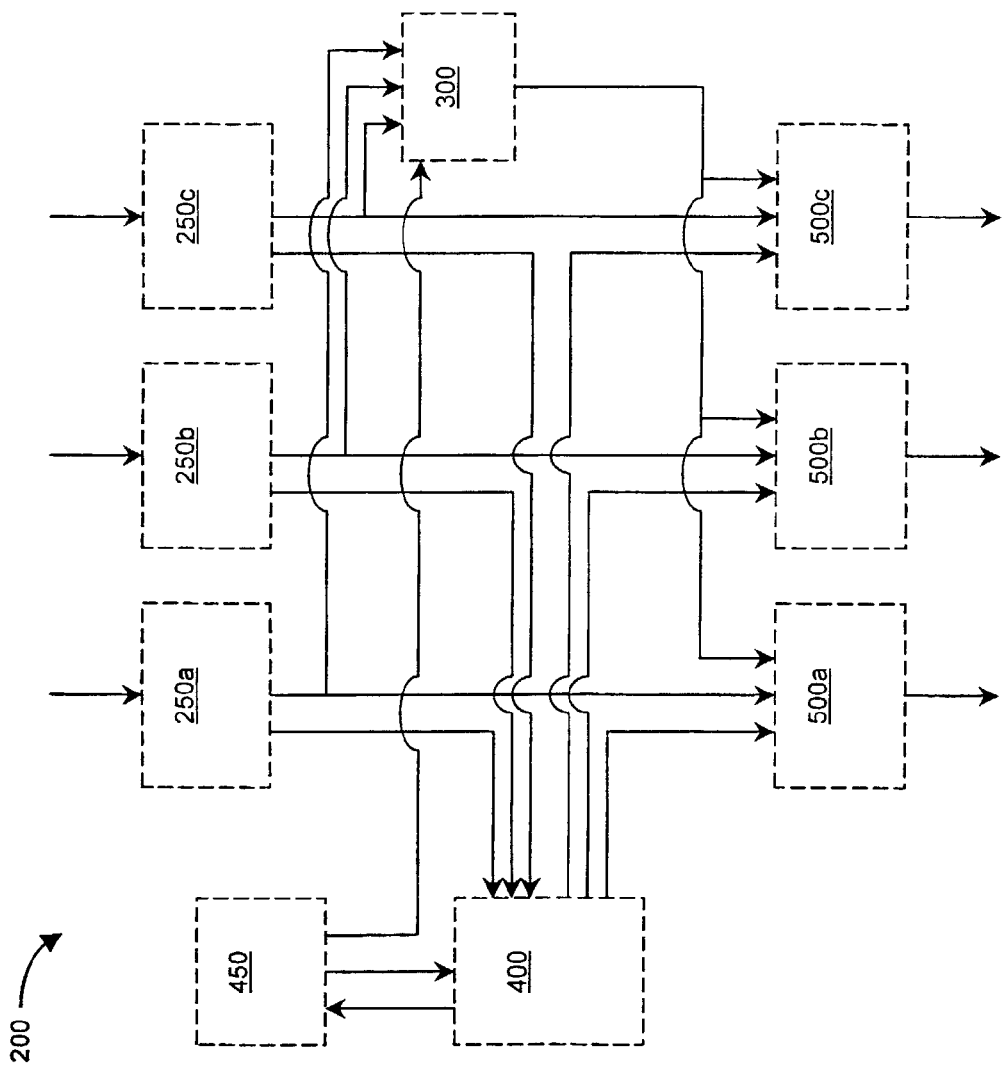
FIG. 2 schematically shows an exemplifying design of a network node according to an embodiment of the invention.

FIG. 2 schematically shows a network node 200 that comprises three input port blocks 250a–250c, a node synchronization block 300, a switch core 400, a node controller 450, and three output port blocks 500a–500c.

Each one of the input port blocks 250a–250c is arranged to receive regularly occurring frames of data, divided into time slots, from respective input links. The location of each frame on the respective link is identified by an input frame synchronization signal, also being referred to as a frame start signal while being located in the stream of data to mark the beginning of each frame, which is carried along with the frames on the respective link. In this example, it is assumed that the frame frequency is nominally 8 kHz, corresponding to a frame length of 125 μs. Consequently, the frame synchronization signal of each respective link will be nominally received each 125 μs at the respective input port block.

Each input port block 250a–250c is arranged to derive data from time slots of received frames and to transmit such slot data to the switch core 400. Also, each input port block 250a–250c is arranged to derive the respective input frame synchronization signal from the respective input stream of data and to transmit said signal to the node synchronization block 300 and to a respective output port block 500a–500c.

The switch core 400 is arranged to switch slots of data from the input port blocks 250a–250c to the output port blocks 500a–500c in accordance with switching instructions defined by the node controller 450. Furthermore, the switch core 400 is arranged to switch slots of data received in one or more control channels at the input port blocks 250a–250c from the input port blocks 250a–250c to the node controller 450, and to switch time slots of data to be transmitted in one or more control channels at the output port blocks 500a–500c from the node controller 450 to the output port blocks 500a–500c.

Data received/transmitted in said control channels from/to other nodes of the network will typically include channel management information. Based upon such channel management information, the node controller 450 will provide the switch core 400 with said switching instructions.

Data received/transmitted in said control channels will also include synchronization messages of the kind - discussed -above with -reference to FIG. 1. Based upon an evaluation of such synchronization messages, the node controller 450 will select which input link, i.e. which input frame synchronization signal, that is to be used as synchronization source for synchronizing of the operation of the node 200. Based upon such a selection, the node controller 450 is connected to provide the node synchronization block 300 with a synchronization selection signal that identifies which input frame synchronization signal to use as synchronization source, the timing at which a switch to using another frame synchronization signal as synchronization source is to take place, and similar related information.

The node synchronization block 300 is connected to receive the input frame synchronization signals from the respective input port blocks 250a–250c and the synchronization selection signal from the node controller 450. Based upon these signals, the node synchronization block 300 is arranged to generate a node internal frame synchronization signal, also referred to below as node synchronization signal. The node synchronization signal is generated to have a continuous phase, i.e. to be essentially phase-shift free, which means that a change of synchronization source for generating said node synchronization signal will not cause any essential discontinuities or phase-shifts in the node synchronization signal. The node synchronization signal generated by the node synchronization block is transmitted to each one of the output port blocks 500a–500c. Examples on how the phase-shift free node synchronization signal is generated by the node synchronization block 300 will be described in detail below with reference to FIGS. 3A and 3B.

Each one of the output port blocks 500a–500c typically receives data in slots from the switch core 400, input frame synchronization signals from a respective input port block 250a–250c, and the node synchronization signal from the node synchronization block 300. Using the node synchronization signal as synchronization source, optionally taking into account the phase of the respective received input frame synchronization signal, each output port will generate a respective output frame synchronization signal and will transmit said output frame synchronization signal as a frame start signal along with frames of time slot data received from the switch core 400 on a respective output link. Examples on how this is performed will be described in detail below with reference to FIGS. 5A and 5B.

In operation, input port block 250a and output port block 500a could typically be configured as together forming a first input/output interface, input port block 250b and output port block 500b would be configured as together forming a second input/output interface, and input port block 250c and output port block 500c, would be configured as together forming a third input/output interface. Each interface would then optionally be connected to provide read and write access to a respective unidirectional bus, wherein frames of slots received at, for example, the input port 250a would be switched essentially as a whole by the switch core 400 to be transmitted essentially unaffected, with the exemption of specific slots being switch to/from other ports, at output port 500a. As an example, if node 200 would be configured as node 113 in FIG. 1, said first interface would be connected to provide access to the unidirectional bus from node 111 to node 115. More specifically, input port block 250a would be connected to the link from node 112 and output port block 500a would be connected to the link to node 114. Similarly, said second interface would be connected to provide access to the uni-directional bus from node 115 to node 111, and said third interface would be connected to provide access to the unidirectional single ring bus.

An embodiment 300 exemplifying an implementation the node synchronization block 300 shown in FIG. 2 will now be described with reference to FIG. 3. The embodiment 300 comprises a selection unit 343, a phase offset detector 313, a first sample-and-hold circuit 323, a subtracting circuit 324, a low-pass filter 325, an adding circuit 326, a second sample-and-hold circuit 327, and a node synchronization signal generator 348.

Figure 3:
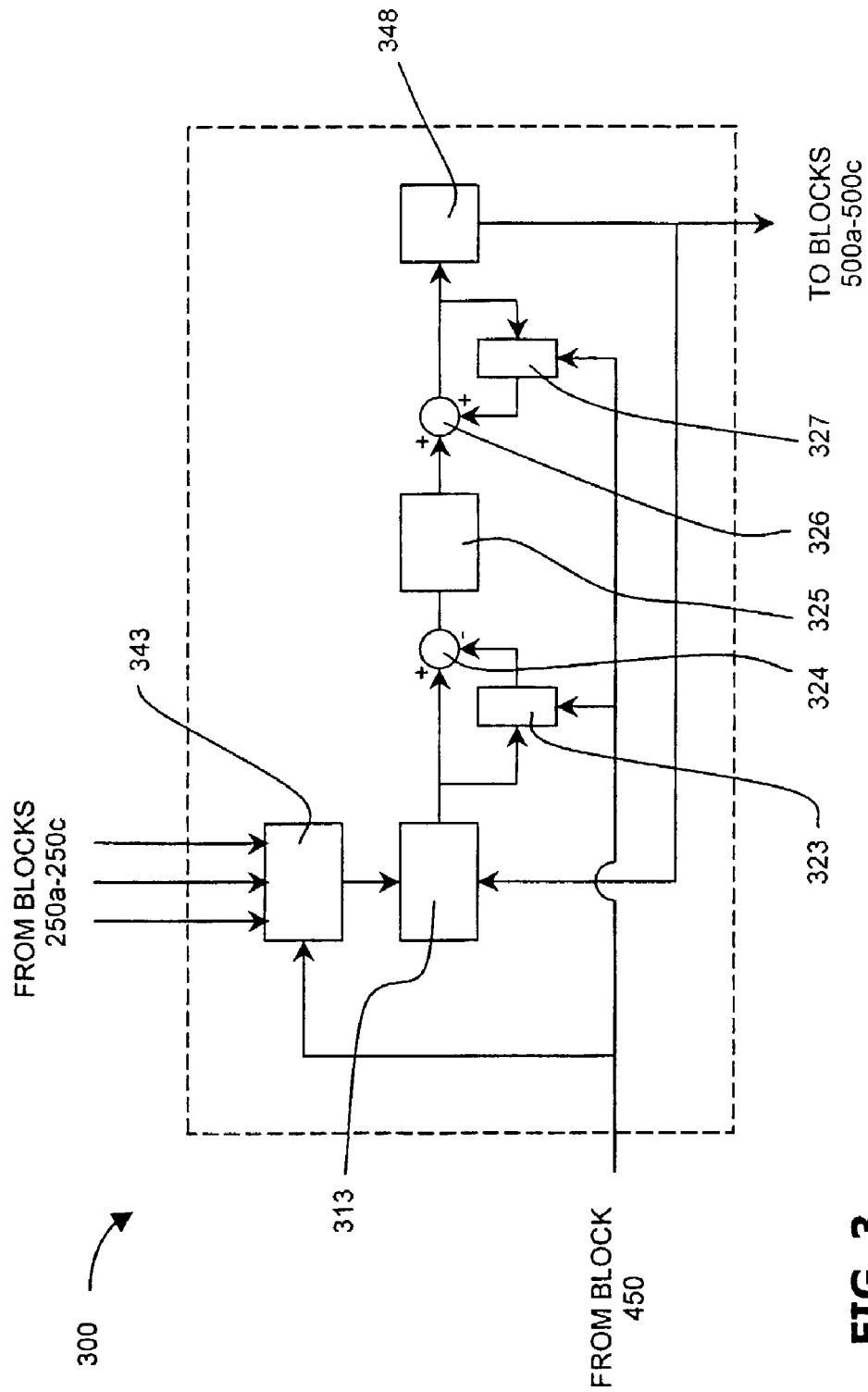
FIG. 3 schematically show an embodiment of the node synchronization block shown in FIG. 2.

As illustrated in FIG. 3, the block 300 is connected to receive input frame synchronization signals from all input port blocks 250a–250c. The block 300 is moreover arranged to generate a phase-shift free node synchronization signal based thereupon as controlled by control signals from the node controller 450, and to output said node synchronization signal to the output port blocks 500a–500c.

For that purpose, the selection unit 343 is connected to receive the input frame synchronization signals from the three input port blocks 250a–250c, and to forward signals from one of these three input port blocks, as selected by the control signal from the node controller 450, to the phase offset detector 313.

The detector 313 is connected to receive the input frame synchronization signal from the selection unit 343 as well as a feedback copy of the node synchronization signal that is outputted from the generator 348. The detector 313 will determine the phase offset between the node synchronization signal and the input frame synchronization signal, said offset being outputted as an offset value to the first sample-and-hold circuit 323 and to the subtracting circuit 324.

The first sample-and-hold circuit 323 is in turn connected to sample the offset value from the detector 313 and to output a fixed offset value to the subtracting circuit 324. The sampled offset value is used to update the outputted fixed offset value at timings determined by the control signal from the node controller 450.

The subtracting circuit 324 is arranged to subtract the fixed offset value, outputted by the first sample-and-hold circuit 323, from the offset value outputted by the detector 313, and to output a resulting offset deviation to the low-pass filter 325, which in turn outputs a low-pass filtered deviation to the adding circuit 326.

The adding circuit 326 is arranged to add the low-pass filtered deviation, as outputted by the low-pass filter 325, to the output from the second sample-and-hold circuit 327, and to output the thus resulting modified deviation as a frequency control signal to the generator 348 and to the second sample-and-hold circuit 327. The second sample-and-hold circuit 327 is furthermore arranged to sample said modified deviation and to update its fixed output at timings determined by control signals from the node controller 450.

Figure 4:
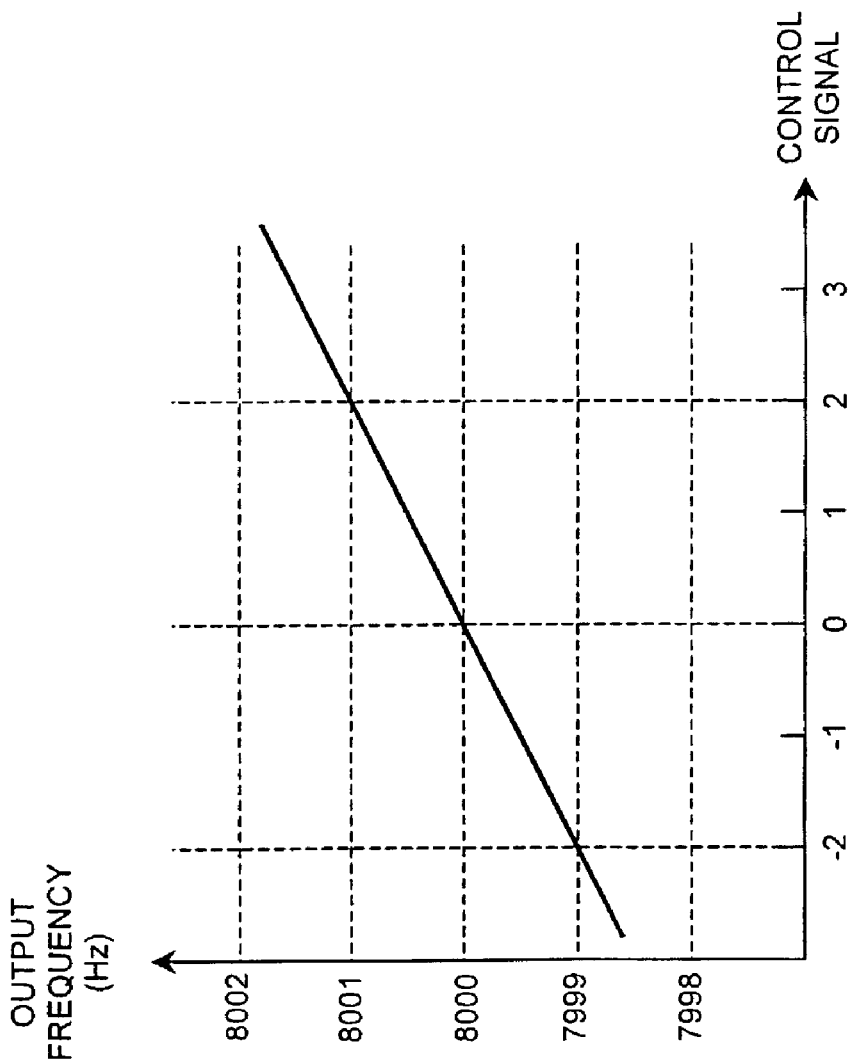
FIG. 4 schematically shows characteristics of the generator of the node synchronization block illustrated in FIG. 3.

The generator 348 is arranged to generate said node synchronization signal, having a frequency of approximately 8 kHz, as a function of the received control signal. More specifically, the generator 348 in this example has the characteristics illustrated in the diagram of FIG. 4. As shown in FIG. 4, if the received frequency control signal is zero (0), the frequency of the outputted node synchronization signal will be approximately 8000 Hz. However, if the received frequency control signal increases to, lets say, two (2), the frequency of the outputted node synchronization signal will increase to approximately 8001 Hz. Similarly, if the received frequency control signal decreases to, lets say, minus two (−2), the frequency of the outputted node synchronization signal will decrease to approximately 7999 Hz.

The embodiment illustrated in FIG. 3 forms a feed-back loop that continuously strives to bring the offset detected by the detector 313 to be equal to the fixed, "desired" offset output from the first sample-and-hold circuit 323 by the continuous adjustment of the output frame frequency of the generator 348. Any deviation between the offset from the detector 313 and the offset from the hold-over-circuit 323 will result in a non-zero input to the low-pass filter. If such a deviation is persistent over time, -t will eventually be forwarded via the low pass filter 325 and the adding circuit 326 to the generator 348, and will then cause a small change in the frequency of the outputted node synchronization signal. This small change in frequency will act to slowly bring said difference back to zero.

To be noted, in a steady state situation, the frequency control signal inputted to the generator 348 will reflect the frequency of the input synchronization signal that is currently forwarded by the selection unit 343. Consequently, at repeated intervals, the node controller 450 will instruct the second sample-and-hold circuit 327 to incrementally/decrementally update its output in accordance with the current output from the adding circuit 326. This updating of the output of the second sample-and-hold circuit 327 provides a means for "memorizing" the network frequency. Note however that such updatings are in this exemplified embodiment performed in small steps in order to not give rise to any sudden large changes in the frequency control signal input to the generator 348.

In FIG. 3, when a change of synchronization source is to take place, the node controller will instruct the selection unit 343 to forward another input synchronization signal to the detector 313. As soon as the offset between the new input synchronization signal and the node synchronization signal has been determined and outputted by the detector 313, the node controller 450 will instruct the first sample-and-hold circuit 323 to update its output with to this new offset. The new offset is thereby set as the new desired offset that the design will strive to maintain in relation to the new input synchronization signal. As is understood, the normalization of the offset, as performed by the subtracting unit 324, in conjunction with the use of the low-pass filter 325, provides for a smooth behavior of the node synchronization signal generated by the generator 348 when switching synchronization source.

An embodiment 500-A exemplifying an implementation of an output port block of the kind denoted 500a–500c in FIG. 2 will now be described with reference to FIG. 5A. The embodiment 500-A comprises a frame buffer 510, an output port 520, a phase offset detector 530, a phase offset control unit 540, and a phase offset generator 550.

Figures 5A, 5B:
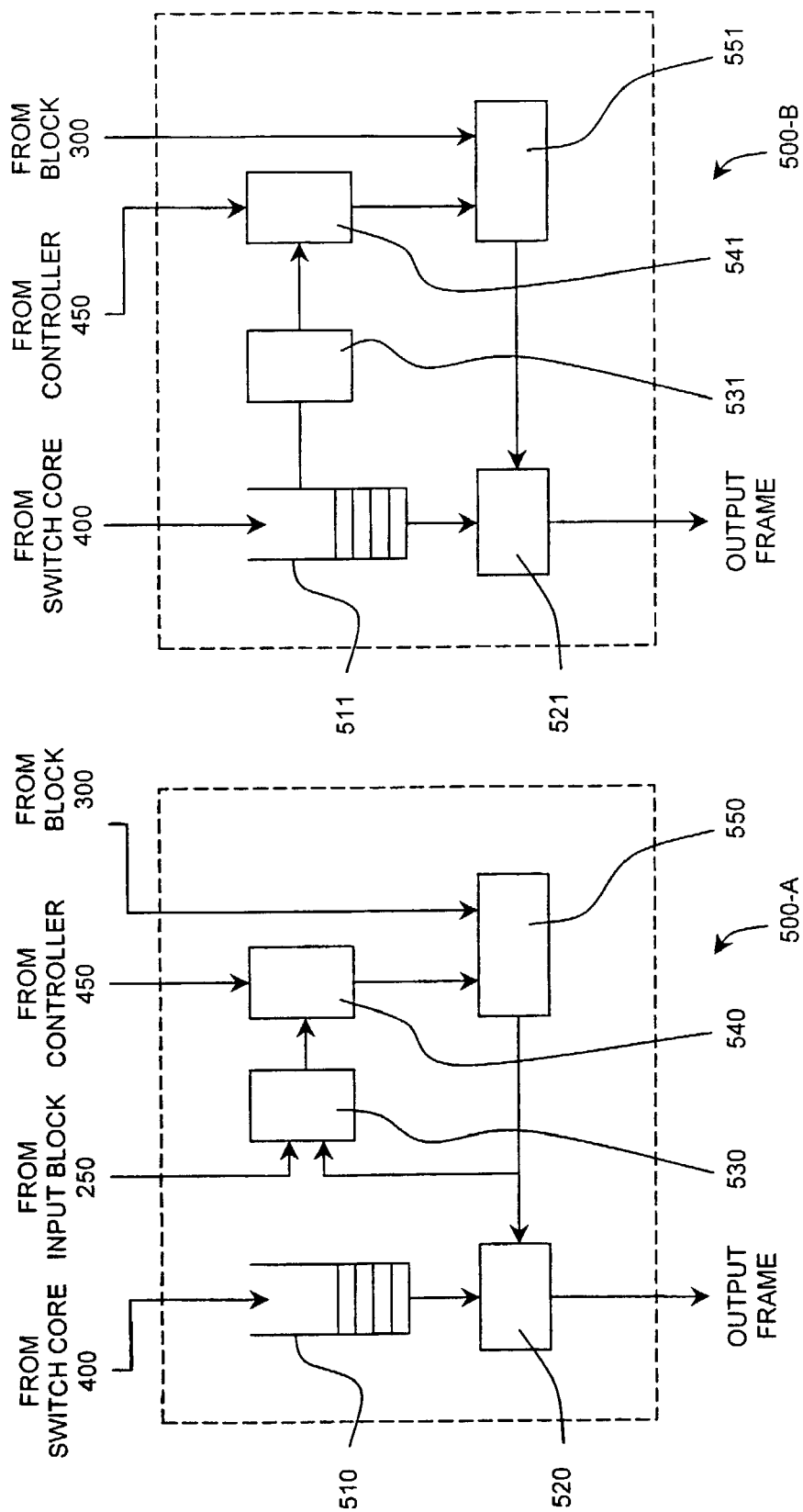
FIGS. 5A and 5B schematically show two different embodiments of the invention exemplifying implementations the output port blocks shown in FIG. 2.

As described above with reference to FIG. 2, and as illustrated in FIG. 5A, the block 500-A is connected to receive time slot data from the switch core 400, an input frame synchronization signal from a respective one of the input port blocks 250a–250c, a phase control signal (not shown in FIG. 2) from the node controller 450, and the node synchronization signal from block 300. Based upon the inputs, the block 500-A is arranged to output frames.

For that purpose, the frame buffer 510 is connected to receive said time slot data from the switch core and to store said time slot data prior to the transmission thereof from the output port 520. The output port 520 is in turn arranged to receive an output frame synchronization signal from the phase offset generator 550 and to transmit 1251s frames of time slot data, as provided by the frame buffer, using said output frame synchronization signal to synchronize the transmission of the start of each frame.

The phase offset detector 530 is connected to receive the input frame synchronization signal from the respective one of the input port blocks 250a–250c, as well as a feedback copy of the output frame synchronization signal from the phase offset generator 550.

The detector 5301s arranged to determine the phase difference, i.e. phase offset, between the input frame synchronization- signal and the output frame synchronization signal. The detector 530 is implemented as a counter that is reset and started at the reception of each input frame synchronization signal and that is stopped at the reception of each output frame synchronization signal, counting at a rate of approximately 1000 counts per 125 µs. Each so determined offset, provided as an offset count in the interval of 0 to approximately 1000, is then outputted to the phase offset control unit 540.

As illustrated in FIG. 5A, the phase offset control unit 540 is connected to receive the phase offset count from the detector 530, as well as the phase offset control signal from the node controller 450. As the phase offset count represents the difference in time between the input frame synchronization signal and the output frame synchronization signal, it also will reflect the overall delay through the node in FIG. 2, i.e. the time that it takes for data to pass through the switch from the input port providing the input frame synchronization signal to the output port 520. The purpose of the control unit 540 is to compare the offset count received from the detector 530 with a selected offset count, representing a desired delay through the node, received as said phase offset control signal from the node controller 450. Based upon such a comparison, the control unit 540, typically implemented in software, will generate an output offset count that is outputted to the phase offset generator 550. Typically, if the offset count received from the detector 530 is smaller than the selected offset indicated by the control signal from the node controller 450, i.e. if the delay through the node is smaller than desired, the control unit 540 will increment the offset count outputted to the generator 550. On the other hand, if the offset count received from the detector 530 is higher than the selected offset indicated by the control signal from the node controller 450, i.e. if the delay through the node is larger than desired, the control unit 540 will decrement the- offset count outputted to the generator 550.

The phase offset generator 550 is arranged to receive the node synchronization signal from block 300 and to add the offset received from the control unit 540 thereto, thereby adjusting the phase of the frame synchronization signal outputted from the generator 550 to provide for a desired delay through the node. In this example, the generator 550 is implemented as a counter that is reset and started at the reception of the node synchronization signal and that transmits the phase adjusted output frame synchronization signal at the point in time that the counter reaches the count defined by the offset count input from the control unit 540, counting at said rate of approximately 1000 counts per 125 µs. As another example, a generator of the kind described with reference to FIG. 3 could be used.

The so phase-adjusted output frame synchronization signal from the generator 550 is then fed to the detector 530 and to the output port 520, which will transmit frames of data based thereupon as described above.

Consequently, the function of the detector 530, the control unit 540, and the offset generator 550 is to adjust the transmission of the output frame synchronization signal to provide for a desired delay through the node. Furthermore, as the output frame synchronization signal is generated using the node synchronization signal as reference, the latter having been generated as described above to be essentially phase shift free irrespective of any change of input frame synchronization signal to be used as synchronization source, an essentially continuous behavior of the output frame synchronization signal is ensured.

Another embodiment 500-B exemplifying an implementation an output port block of the kind denoted 500a–500c in FIG. 2 will now be described with reference to FIG. 5B. The embodiment 500-B comprises a frame buffer 511, an output port 521, a buffer fill level detector 531, a phase offset control unit 541, and a phase offset generator 550.

The operation and function of the buffer 511, the output port 521 and the offset generator 551 are essentially the same as those of the buffer 510, the output port 520 and the offset generator 550 described with reference to FIG. 5A, and further detailed description thereof is therefore omitted in the following.

The block 500-B in FIG. 5B differs from the block 500-A in FIG. 5A in that it is not connected to receive the input frame synchronization signal from one of the input port blocks 250a–250c in FIG. 2. Instead, the block 500-B comprises the buffer fill level detector 531 which is arranged to repeatedly determine the fill level of the buffer 511, i.e. to monitor the amount of time slot data that is stored in the frame buffer, and to provide a measure of the fill level to the control unit 541. As the amount of time slot data stored in the frame buffer will depend upon the overall delay through the node, said buffer fill level is compared in the control unit 541 against a desired buffer fill level that is designated by the control signal from the node controller 450. The control unit will then increment or decrement its phase offset count output to the phase offset generator 551 based upon this comparison. Typically, if the measured buffer fill level is smaller than the selected fill level indicated by the control signal from the node controller 450, typically corresponding to a smaller delay than desired, the control unit 541 will increment the offset count outputted to the generator 551. On the other hand, if the determined buffer fill level is higher than the desired fill level indicated by the control signal from the node controller 450, typically corresponding to a higher delay than desired, the control unit 541 will decrement the offset count outputted to the generator 551.

Consequently, the block 500-B uses the buffer fill level of the buffer 511 as a measure of the delay, and adjusts the transmission of the output frame synchronization signal accordingly. With this exemption, the operation of the block 500-B is essentially the same as the one of the block 500-A described above with reference to FIG. 5A.

Even though exemplifying embodiments of the invention have been described in detail above with reference to the accompanying drawings, different modifications, combinations and alterations thereof may be made within the scope of the invention, which is defined by the accompanying claims.

The invention claimed is:

1. A method for synchronizing operation at a node of a communication network, said method comprising:
   receiving two or more input frame synchronization signals and transmitting an output frame synchronization signal;
   defining a node common frame synchronization signal based upon one or more of said input frame synchronization signals;
   generating the output frame synchronization signal using the node common frame synchronization signal as reference for synchronization;
   determining a phase relationship between the output frame synchronization signal and at least one of the input frame synchronization signals; and, adjusting said phase relationship by adjusting a phase relationship between the output frame synchronization signal and the node common synchronization signal when generating the output frame synchronization signal,
   wherein said output frame synchronization signal is synchronized in relation to said at least one of the input frame synchronization signal in such a way that:
   a) said output frame synchronization signal is permitted to show an arbitrary phase difference in relation to said at least one of said input frame synchronization signal;
   b) said output frame synchronization signal is permitted to show an acceptable phase jitter in relation to said at least one of said input frame synchronization signals; and
   c) said output frame synchronization signal is not permitted to show any persistent phase drift in relation to said at least one of said input frame synchronization signal.

2. A method as claimed in claim 1, wherein said adjusting step is performed with the purpose of controlling the time difference between each transmission of the output frame synchronization signal and each reception of said at least one of the input frame synchronization signals.

3. A method as claimed in claim 2, wherein said adjusting step comprises increasing said phase difference if said time difference is smaller than a selected time difference, and decreasing said phase difference if said time difference is larger than said selected time difference.

4. A method as claimed in claim 1, wherein data to be outputted as part of frames defined by said output frame synchronization signal is stored in a memory prior to transmission thereof, the data fill level of said memory reflecting the phase relationship between the output frame synchronization signal and the input frame synchronization signal that is associated therewith, and wherein the phase relationship between the output frame synchronization signal and the node common synchronization signal is adjusted so as to maintain a selected data fill level of said memory.

5. A method as claimed in claim 1, wherein frames defined by said frame synchronization signals occur regularly, are of fixed size, and are each divided into a plurality of fixed sized time slots.

6. A method as claimed in claim 1, comprising:
   transmitting, in addition to said output frame synchronization signal, at least one other output frame synchronization signal, each output frame synchronization signal being generated using said node common synchronization signal as reference for synchronization; and
   adjusting each output frame synchronization signal individually to show a respective phase relationship in relation to said node common synchronization.

7. A method as claimed in claim 1, each output frame synchronization signal being associated with a respective input frame synchronization signal, said method comprising adjusting a respective phase relationship between each respective output frame synchronization signal and the respective associated input frame synchronization signal by adjusting the respective phase relationship between each respective output frame synchronization signal and the node common frame synchronization signal.

8. A method as claimed in claim 1, comprising defining said node common frame synchronization signal in such a way that a change in the selection of input frame synchronization signal to define said node common synchronization signal does not cause any phase shifts in said node common synchronization signal.

9. A method as claimed in claim 1, comprising determining the frame phase difference between the node common synchronization signal and at least one of said input frame synchronization signals that is to define said node common synchronization signal, wherein a change into using said input frame synchronization signal to define said node common synchronization signal is performed in such a way that the determined frame phase difference between said node synchronization signal and said input frame synchronization signal is maintained.

10. A method as claimed in claim 1, wherein said method is performed in a time division multiplexed circuit switched network.

11. A method as claimed in claim 1, wherein each one of said frame synchronization signals is an in-band frame start signal that is transmitted on a respective link to designate the start of each frame transmitted thereon.

12. A method for synchronizing operation at a node of a communication network, comprising:
   receiving an input frame synchronization signal;
   transmitting an output frame synchronization signal that is associated with said input frame synchronization signal; and
   controlling a phase relationship between the output frame synchronization signal and the input frame synchronization signal by the step of adjusting a phase relationship between the output frame synchronization signal and a signal that is defined optionally using another input frame synchronization signal as reference for synchronization;
   wherein said output frame synchronization signal is synchronized in relation to the input frame synchronization signal in such a way that:
   a) said output frame synchronization signal is permitted to show an arbitrary phase difference in relation to said input frame synchronization signal:
   b) said output frame synchronization signal is permitted to show an acceptable phase jitter in relation to said input frame synchronization signals:
   and
   c) said output frame synchronization signal is not permitted to show any persistent phase drift in relation to said input frame synchronization signal.

13. An apparatus in a communication network, said apparatus comprising:
- an interface defined by input means (250) for receiving an input frame synchronization signal and associated output means (500) for transmitting an associated output frame synchronization signal;
- means (300) for providing a node common synchronization signal derived from one or more input frame synchronization signals;
- means (530; 531) for determining a phase relationship between the first mentioned input frame synchronization signal and the associated output frame synchronization signal; and
- means (540,550; 541,551) for generating said output frame synchronization signal using said node common synchronization signal as reference and, in doing so, adjusting the phase relationship between the first mentioned input frame synchronization signal and the output frame synchronization signal as desired by adjusting a phase relationship between the node common synchronization signal and the output frame synchronization signal,
- said apparatus being arranged to synchronize said output frame synchronization signal in relation to an input frame synchronization signal in such a way that:
  a) said output frame synchronization signal is permitted to show an arbitrary phase difference in relation to said input frame synchronization signal:
  b) said output frame synchronization signal is permitted to show a limited phase jitter in relation to said input frame synchronization signal: and
  c) said output frame synchronization signal is not permitted to show any persistent phase drift in relation to said input frame synchronization signal.

14. An apparatus as claimed in claim 13, comprising means (530,540,550; 531,541,551) for generating another output frame synchronization signal using said node common synchronization signal as reference and, in doing so, adjusting a phase relationship between said another output frame synchronization signal and a respective input frame synchronization signal associated there- with by adjusting a phase difference between said another output frame synchronization signal and the node common synchronization signal.

15. An apparatus as claimed in claim 14, comprising means (450,540; 450,541) for adjusting said phase differences of said output frame synchronization signals in relation to said node synchronization signal so that each one of said output frame synchronization signals is controlled to show a respective phase difference in relation to said node synchronization signal, said respective phase difference being controlled individually for each respective output frame synchronization signal.

16. An apparatus as claimed in claim 13, said means (300) for providing a node common synchronization signal being arranged to derive said node common synchronization signal in such a way that a change of input frame synchronization signal to be used to derive the node common synchronization signal does not cause any phase shifts in said node common synchronization signal.

17. An apparatus as claimed in claim 13, wherein said apparatus is operating in a time division multiplexed circuit switched network.

18. An apparatus in a communication network, comprising:
- an interface comprising an input port for receiving an input frame synchronization signal and an output port for transmitting an output frame synchronization signal; and
- means being arranged to control a phase relationship between the output frame synchronization signal and the input frame synchronization signal by adjusting a phase relationship between the output frame synchronization signal and a reference signal that as such is defined optionally using another input frame synchronization signal as reference for synchronization,
- said apparatus being arranged to synchronize said output frame synchronization signal in relation to an input frame synchronization signal in such a way that:
  a) said output frame synchronization signal is permitted to show an arbitrary phase difference in relation to said input frame synchronization signal;
  b) said output frame synchronization signal is permitted to show a limited phase jitter in relation to said input frame synchronization signal: and
  c) said output frame synchronization signal is not permitted to show any persistent phase drift in relation to said input frame synchronization signal.

* * * * *